US012537167B2

(12) United States Patent
Hirayama

(10) Patent No.: US 12,537,167 B2
(45) Date of Patent: Jan. 27, 2026

(54) PLASMA PROCESSING APPARATUS

(71) Applicant: Tokyo Electron Limited, Tokyo (JP)

(72) Inventor: Masaki Hirayama, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 35 days.

(21) Appl. No.: 18/755,946

(22) Filed: Jun. 27, 2024

(65) Prior Publication Data

US 2025/0014864 A1 Jan. 9, 2025

(30) Foreign Application Priority Data

Jul. 7, 2023 (JP) ................................ 2023-112413

(51) Int. Cl.
*H01J 37/32* (2006.01)

(52) U.S. Cl.
CPC ....... *H01J 37/321* (2013.01); *H01J 2237/327* (2013.01)

(58) Field of Classification Search
CPC .......................... H01J 37/321; H01J 2237/327
See application file for complete search history.

(56) References Cited

U.S. PATENT DOCUMENTS

| | | | | |
|---|---|---|---|---|
| 11,443,927 | B2 * | 9/2022 | Hirayama | H01J 37/32522 |
| 2020/0052183 | A1 * | 2/2020 | Shainline | G06N 3/067 |
| 2022/0020569 | A1 * | 1/2022 | Hirayama | H01J 37/32229 |
| 2024/0071730 | A1 * | 2/2024 | Hirayama | H01J 37/32623 |
| 2024/0087849 | A1 * | 3/2024 | Hirayama | H01J 37/32568 |
| 2024/0242936 | A1 * | 7/2024 | Hirayama | H01J 37/32247 |
| 2024/0242937 | A1 * | 7/2024 | Hirayama | H01J 37/32256 |
| 2025/0014863 | A1 * | 1/2025 | Hirayama | H01J 37/32229 |
| 2025/0014864 | A1 * | 1/2025 | Hirayama | H01J 37/321 |
| 2025/0201533 | A1 * | 6/2025 | Hirayama | H01J 37/32834 |

FOREIGN PATENT DOCUMENTS

| | | | | | |
|---|---|---|---|---|---|
| JP | 2003183839 | A | * | 7/2003 | H01L 21/02247 |
| JP | 2020-092031 | A | | 6/2020 | |
| JP | 2020092028 | A | * | 6/2020 | H01J 37/32174 |
| JP | 2020092032 | A | * | 6/2020 | H01J 37/32715 |
| JP | 2023010536 | A | * | 1/2023 | |
| JP | 2024101980 | A | * | 7/2024 | |
| KR | 20230008604 | A | * | 1/2023 | H01J 37/32834 |
| WO | WO-2018108191 | A1 | * | 6/2018 | H05H 1/54 |
| WO | WO-2025013616 | A1 | * | 1/2025 | H05H 1/46 |
| WO | WO-2025013617 | A1 | * | 1/2025 | H05H 1/46 |
| WO | WO-2025013645 | A1 | * | 1/2025 | C23C 16/509 |
| WO | WO-2025094719 | A1 | * | 5/2025 | H05H 1/46 |

* cited by examiner

*Primary Examiner* — Adam D Houston
(74) *Attorney, Agent, or Firm* — Armstrong Teasdale LLP

(57) ABSTRACT

A plasma processing apparatus includes a chamber, a substrate support, an excitation electrode, and a resonator. The resonator includes an inner side portion and an outer side portion extending coaxially, and conductive plates arranged parallel to each other in a vertical direction. The resonator provides a waveguide path extending between the inner and outer side portions and including a plurality of layers arranged alternately with the conductive plates. Each of the plurality of layers is connected to a layer thereabove at one of a plurality of folded portions along the inner side portion or the outer side portion. A lowermost conductive plate includes a plurality of slots electromagnetically coupled to the discharger. The plurality of slots is arranged in a circumferential direction, and a wall surrounding a lowermost layer in the outer side portion extends along sides of a polygon.

9 Claims, 6 Drawing Sheets

PLASMA PROCESSING APPARATUS

CROSS-REFERENCE TO RELATED APPLICATION

This application is based upon and claims the benefit of priority from Japanese Patent Application No. 2023-112413, filed on Jul. 7, 2023, the entire contents of which are incorporated herein by reference.

TECHNICAL FIELD

Exemplary embodiments of the present disclosure relate to a plasma processing apparatus.

BACKGROUND

A plasma processing apparatus is used in processing a substrate. As a type of plasma processing apparatus, an apparatus that excites gas using radio frequency waves such as very radio frequency (VHF) waves or ultra radio frequency (UHF) waves is known. Patent Document 1 below discloses such a plasma processing apparatus. The plasma processing apparatus of Patent Document 1 includes a processing container, a stage, an upper electrode, an introducer, and a waveguide portion. The stage is provided in the processing container. The upper electrode is provided above the stage with a space in the processing container interposed therebetween. The introducer is a radio frequency introducer. The introducer is provided at an end of the space in a lateral direction and extends in a circumferential direction around a central axis line of the processing container. The waveguide portion is configured to supply radio frequency waves to the introducer. The waveguide portion includes a resonator that provides a waveguide path. The waveguide path of the resonator extends circumferentially around the central axis line and extends in a direction in which the central axis line extends so as to be connected to the introducer.

PRIOR ART DOCUMENT

Patent Document

Patent Document 1: Japanese Patent Laid-Open Publication No. 2020-92031

SUMMARY

According to one embodiment of the present disclosure, a plasma processing apparatus includes a chamber configured to provide a processing space therein; a substrate support provided in the processing space; an excitation electrode provided above the substrate support; a discharger provided to discharge electromagnetic waves into a plasma generation space below the excitation electrode; and a resonator provided on the excitation electrode and electromagnetically coupled to the discharger. The discharger extends around a central axis line of the chamber and the excitation electrode. The resonator includes an inner side portion and an outer side portion extending coaxially with respect to the central axis line, and a plurality of conductive plates arranged parallel to each other in a vertical direction, which is a direction in which the central axis line extends. The resonator provides a waveguide path extending between the outer side portion and the inner side portion and including a plurality of layers arranged alternately with the plurality of conductive plates. Each of the plurality of layers is connected to a layer thereabove among the plurality of layers at one of a plurality of folded portions along the inner side portion or the outer side portion. A lowermost conductive plate among the plurality of conductive plates includes a plurality of slots electromagnetically coupled to the discharger. The plurality of slots is arranged in a circumferential direction with respect to the central axis line, and a wall surrounding a lowermost layer among the plurality of layers in the outer side portion extends along sides of a polygon in cross section perpendicular to the central axis line.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
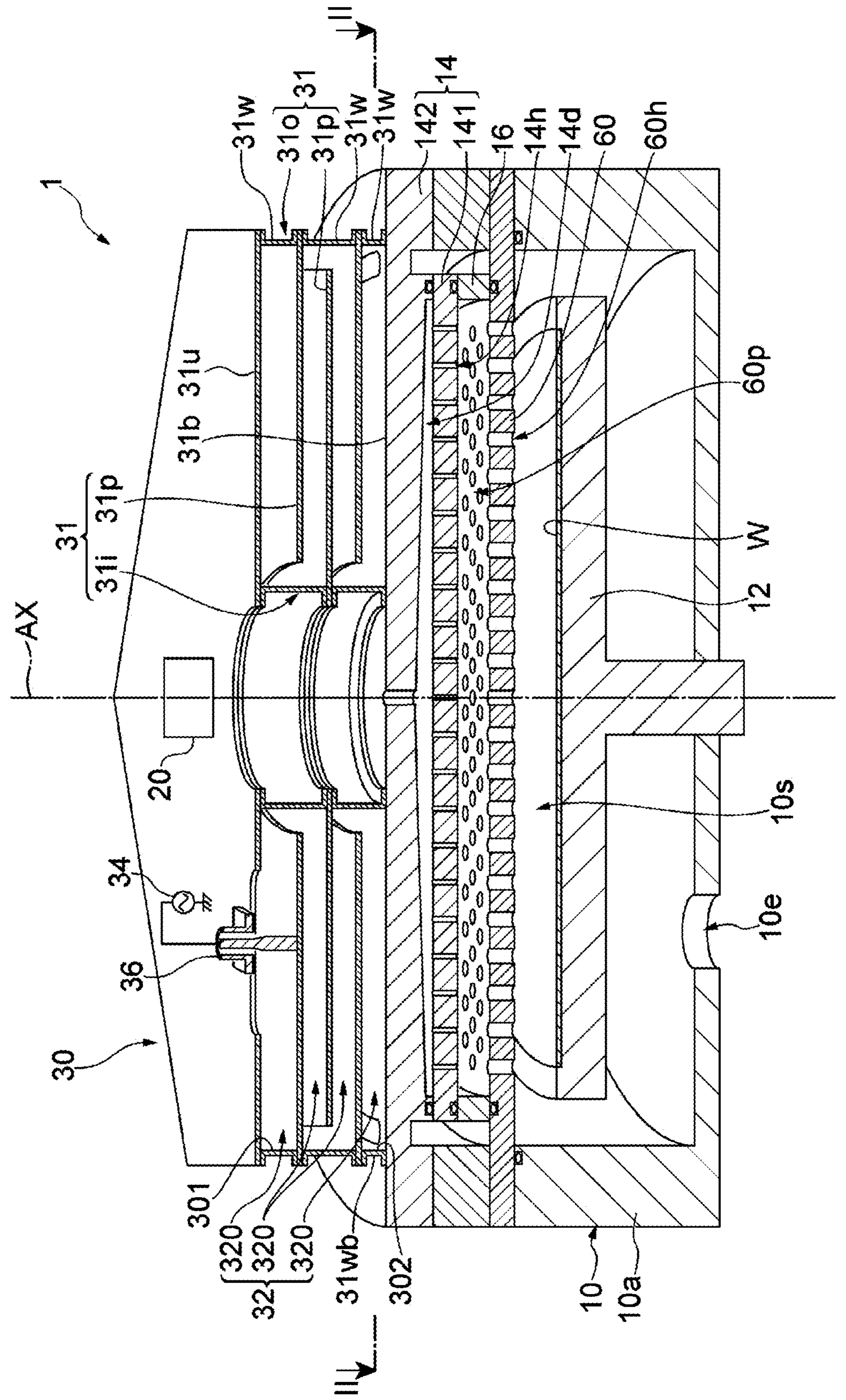
FIG. 1 is a diagram illustrating a plasma processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In each drawing, the same or corresponding components are denoted by the same reference numerals.

Figure 2:
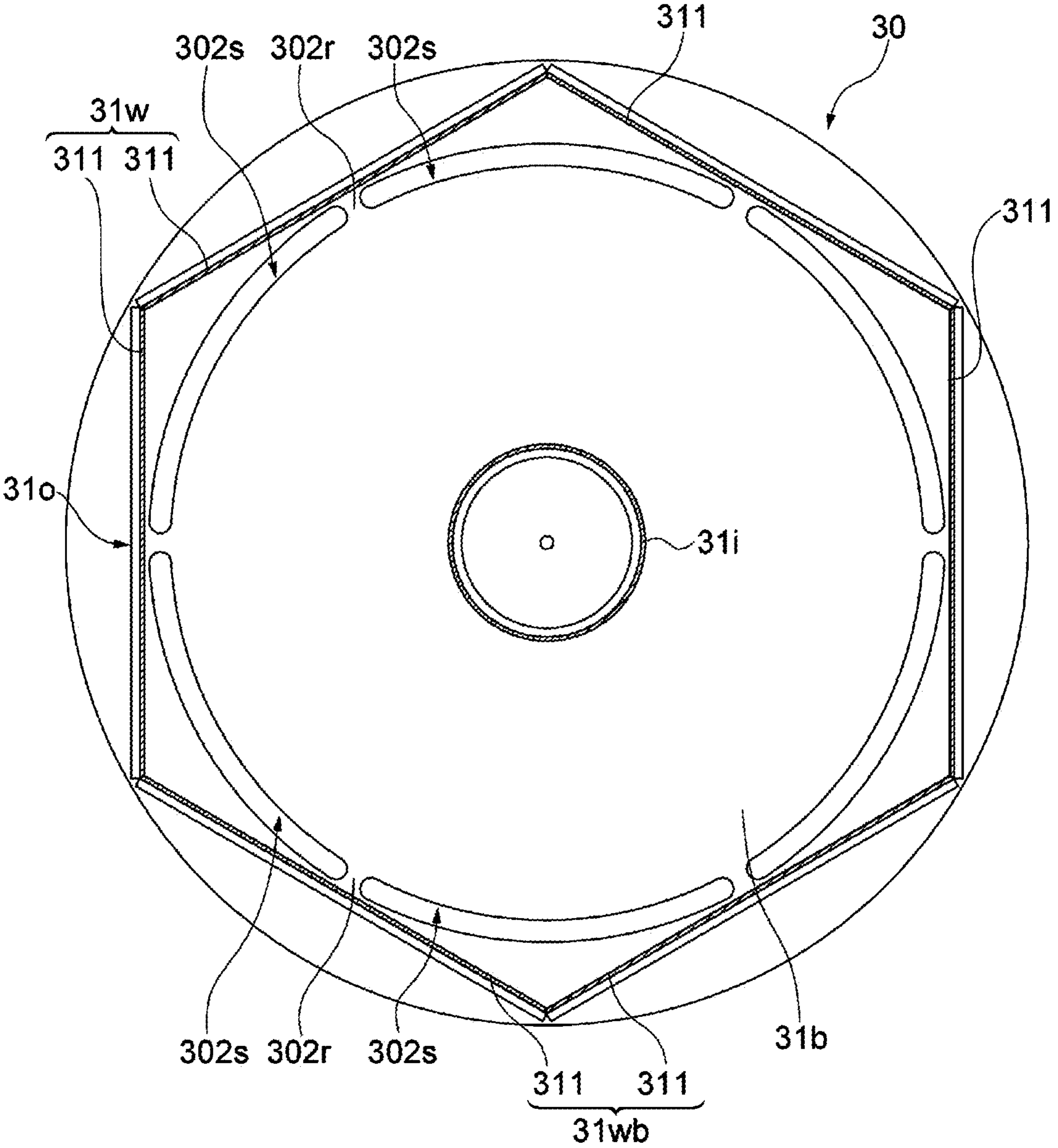
FIG. 2 is a cross-sectional view taken along line II-II in FIG. 1.

FIG. 1 is a diagram illustrating a plasma processing apparatus according to one exemplary embodiment. FIG. 2 is a cross-sectional view taken along line II-II in FIG. 1. A plasma processing apparatus 1 illustrated in FIGS. 1 and 2 includes a chamber 10, a substrate support 12, an excitation electrode 14, a discharger 16, and a resonator 30.

The chamber 10 includes a processing space **10*s* in the chamber 10. In the plasma processing apparatus 1, a substrate W is processed inside the processing space 10*s*. The chamber 10 is made of a metal such as aluminum and is grounded. The chamber 10 has a side wall 10*a* and is open at its upper end. The chamber 10 and the side wall 10*a* may have a substantially cylindrical shape. The processing space 10*s* is provided inside the side wall 10*a*. A central axis line of each of the chamber 10, the side wall 10*a*, and the processing space 10*s* is an axis line AX. The chamber 10 may have a corrosion-resistant film on the surface of the chamber 10**. The corrosion-resistant film may be an yttrium oxide film, an yttrium oxide fluoride film, an yttrium fluoride film, or a ceramic film including yttrium oxide, yttrium fluoride, or the like.

An exhaust port 10*e* is formed in a bottom of the chamber 10. An exhaust device is connected to the exhaust port 10*e*. The exhaust device may include a vacuum pump, such as a dry pump and/or a turbomolecular pump, and an automatic pressure control valve.

The substrate support 12 is installed in the processing space 10*s*. The substrate support 12 is configured to substantially horizontally support the substrate W on an upper surface of the substrate support 12. The substrate support 12 has a substantially disc shape. A central axis line of the substrate support 12 is the axis line AX.

The excitation electrode 14 is installed above the substrate support 12 with the processing space 10*s* interposed therebetween. The excitation electrode 14 is made of a conductive material such as a metal (e.g., aluminum) and has a substantially disc shape. A central axis line of the excitation electrode 14 is the axis line AX.

The plasma processing apparatus 1 further includes an electrode 60. The electrode 60 is another excitation electrode. The electrode 60 has a substantially disc shape and is disposed so as to close an opening of the upper end of the chamber 10. The electrode 60 provides a plurality of holes 60*h*. The plurality of holes 60*h* penetrates the electrode 60 in a thickness direction. The excitation electrode 14 is disposed above the electrode 60. The excitation electrode 14 and the electrode 60 form a plasma generation space 60*p* therebetween. In the plasma processing apparatus 1, the plasma generation space 60*p* is separated from the processing space 10*s* and is provided above the processing space 10*s*.

The discharger 16 is provided to discharge electromagnetic waves therefrom into the plasma generation space 60*p*. In the plasma processing apparatus 1, the discharger 16 surrounds the plasma generation space 60*p* and is supported between the excitation electrode 14 and the electrode 60. The electromagnetic waves discharged from the discharger 16 into the plasma generation space 60*p* may be radio frequency waves such as VHF waves or UHF waves. The discharger 16 is formed of a dielectric material such as quartz, aluminum nitride, or aluminum oxide. The discharger 16 extends in a circumferential direction around the axis line AX. The discharger 16 may have an annular shape.

In one embodiment, the excitation electrode 14 may include a shower plate 141 and an upper electrode 142. The shower plate 141 is provided above the plasma generation space 60*p*. The shower plate 141 provides a plurality of gas holes h. The plurality of gas holes 14*h* extends in a thickness direction (vertical direction) of the shower plate 141 and penetrates the shower plate 141.

The upper electrode 142 is provided on the shower plate 141. The upper electrode 142 forms a gas diffusion chamber 14*d* between the shower plate 141 and the upper electrode 142. A gas supply 20 is connected to the gas diffusion chamber 14*d*. Gas from the gas supply 20 is discharged into the plasma generation space 60*p* from the plurality of gas holes 14*h* via the gas diffusion chamber 14*d*.

In the plasma processing apparatus 1, the gas in the plasma generation space 60*p* is excited by the electromagnetic waves discharged from the discharger 16 into the plasma generation space 60*p*. As a result, plasma is generated in the plasma generation space 60*p*. Active species in the plasma generated in the plasma generation space 60*p* are supplied to the processing space 10*s* from the plurality of holes 60*h*.

The resonator 30 is installed on the excitation electrode 14. The resonator 30 is electromagnetically coupled to the discharger 16. The resonator 30 includes a waveguide path 32. The resonator 30 includes a conductive portion 31 that defines the waveguide path 32. The conductive portion 31 is made of a conductive material such as a metal. The conductive material forming the conductive portion 31 may include aluminum, stainless steel, copper, or brass.

The resonator 30 includes a first end 301 and a second end 302. The first end 301 is one end of the waveguide path 32, and the second end 302 is the other end of the waveguide path 32. The resonator 30 is configured to reflect electromagnetic waves propagating within the waveguide path 32 at the first end 301 and the second end 302 and cause the electromagnetic waves to resonate. The electromagnetic waves resonating in the resonator 30 are supplied to the discharger 16 from a plurality of slots 302*s*, which will be described later, and are discharged into the plasma generation space.

The plasma processing apparatus 1 may further include a radio frequency power supply 34. The radio frequency power supply 34 is configured to generate radio frequency power. The electromagnetic waves introduced into the plasma generation space is generated based on the radio frequency power generated by the radio frequency power supply 34. The radio frequency power supply 34 may be directly connected to the resonator 30 using a coaxial line. That is, the radio frequency power supply 34 may be coupled to the waveguide path of the resonator 30 without using a matcher for impedance matching. The coaxial line may include a connector 36 as a connection portion to the resonator 30. The connector 36 may be connected to the resonator 30 so as to introduce the electromagnetic waves into the resonator 30 from the uppermost layer of a plurality of layers 320, which will be described later, of the waveguide path 32. In this case, an inner conductor of the connector 36 is connected to a conductive plate 31*p*, which will be described later, that defines the uppermost layer from below, and an outer conductor of the connector 36 is connected to a conductive plate 31*p* (upper wall 31*u*) that defines the uppermost layer from above.

In one embodiment, the waveguide path 32 may have a folded structure including a plurality of folded portions. In one embodiment, the waveguide path 32 may be configured axially or rotationally symmetrically with respect to the axis line AX. Further, in one embodiment, the conductive portion 31 may include an inner side portion 31*i* (or an inner peripheral portion), an outer side portion 31*o* (or an outer peripheral portion), and a plurality of conductive plates 31*p*. The inner side portion 31*i* and the outer side portion 31*o* extend coaxially with respect to the axis line AX. The plurality of conductive plates 31*p* extends radially with respect to the axis line AX and is arranged parallel to each other in the vertical direction, which is a direction in which the axis line AX extends.

Additionally, the waveguide path 32 may include the plurality of layers 320. The plurality of layers 320 extends in a radial direction with respect to the axis line AX between the inner side portion 31*i* and the outer side portion 31*o* and is arranged alternately with the plurality of conductive plates 31*p*. Each of the plurality of layers 320 is connected to a layer thereabove among the plurality of layers 320 at one of the plurality of folded portions along the inner side portion 31*i* or the outer side portion 31*o*.

In one embodiment, the first end 301 is provided above the second end 302. The first end 301 is provided by the outer side portion 31*o* of the resonator 30. The first end 301 surrounds the uppermost layer of the plurality of layers 320. The second end 302 is composed of a wall 31*wb* of the outer side portion 31*o* surrounding the lowermost layer among the plurality of layers 320. The second end 302 extends in the circumferential direction around the axis line AX above the discharger 16. As illustrated in FIG. 2, the plurality of slots 302*s* is formed in a lowest conductive plate 31*b* that defines the lowermost layer from below among the plurality of conductive plates 31*p*. In the plasma processing apparatus 1, the conductive plate 31*b* also serves as the upper electrode 142. The plurality of slots 302*s* is disposed near the second end 302 or along the second end 302. The plurality of slots 302*s* is coupled to the discharger 16 externally to the excitation electrode 14. The plurality of slots 302*s* extends in a circumferential direction with respect to the axis line AX and is arranged in the circumferential direction. In one embodiment, a radial distance between the axis line AX and an outer edge of each of the plurality of slots 302*s* may be substantially identical to the radius of an inscribed circle of a polygon of the wall 31*wb*. In this resonator 30, the electromagnetic waves are reflected toward the first end 301 at the second end 302. Further, some of the electromagnetic waves propagating in the resonator 30 are coupled to the discharger 16 through the plurality of slots 302*s*.

In the plasma processing apparatus 1, the inner side portion 31*i* may have a substantially cylindrical shape having a central axis of the axis line AX. The inner side portion 31*i* may be formed of a tubular (e.g., cylindrical) conductive wall extending between the conductive plates 31*p* which are adjacent in the vertical direction.

In the plasma processing apparatus 1, the outer side portion 31*o* has a substantially tubular shape and has the axis line AX as a central axis thereof. The outer side portion 31*o* may include a plurality of walls 31*w* including the wall 31*wb* surrounding the lowermost layer and walls surrounding upper layers other than the lowermost layer among the plurality of layers 320. Each of the plurality of walls 31*w* extends between the corresponding conductive plates 31*p* adjacent to each other in the vertical direction and has a substantially tubular shape. The wall 31*wb* surrounding at least the lowermost layer of the plurality of walls 31*w* extends along sides of a polygon in cross section perpendicular to the axis line AX. Two or more or all of the walls 31*w* among the plurality of walls 31*w* may extend along the sides of the polygon in cross section perpendicular to the axis line AX. In one embodiment, the wall 31*wb* may have a polygonal tube shape. Further, each of two or more or all of the walls 31*w* among the plurality of walls 31*w* may each have a polygonal tube shape. In addition, in the example illustrated in FIG. 1 and FIG. 2, the polygon is a regular hexagon, but other polygons may be used as the polygon.

In one embodiment, the wall 31*wb* may be formed of a plurality of plate-like bodies 311. Further, each of two or more of the plurality of walls 31*w* or each of all of the walls 31*w* may be formed of the plurality of plate-like bodies 311. Each of the plurality of plate-like bodies 311 is formed of the above-mentioned metal. Each of the plurality of plate-like bodies 311 may be a flat plate. Each of the plurality of plate-like bodies 311 extends along a corresponding side of the polygon in a cross-section perpendicular to the axis line AX.

In the resonator 30, the magnitude of a current flowing into the conductive plate 31*b* in the radial direction with respect to the axis line AX has a distribution in a circumferential direction, in which the magnitude of the current is minimum in a direction from the axis line AX toward each corner of the polygon and is maximum at the center of each side of the polygon. Therefore, in each of the plurality of slots 302*s*, a distribution of electric field intensity is adjusted in the circumferential direction.

In one embodiment, the number of the plurality of slots 302*s* and the number of a plurality of corners of the polygon may be equal. Moreover, the position of each of the plurality of corners of the polygon and a center position of a corresponding slot in the circumferential direction among the plurality of slots 302*s* may be aligned in the radial direction with respect to the axis line AX. Normally, the magnitude of displacement current flowing in the radial direction toward the center of each of the slot 302*s* in the conductive plate 31*b* is the maximum. However, in the resonator 30, the magnitude of current flowing into the conductive plate 31*b* in the radial direction has a distribution in the circumferential direction, in which the magnitude of current is weakened at the center of each of the plurality of slots 302*s* and is strengthened between the adjacent slots 302*s*. Therefore, in each of the plurality of slots 302*s*, uniformity of a distribution of electric field intensity in the circumferential direction is increased.

As illustrated in FIGS. 1 and 2, an edge of each of the plurality of plate-like bodies 311 extending in the vertical direction is connected to an edge of another corresponding plate-like body extending in the vertical direction among the plurality of plate-like bodies 311 at a corresponding corner of the polygon. However, the plurality of plate-like bodies 311 may be spaced apart from each other so as to provide gaps at the corners of the polygon. When the plurality of plate-like bodies 311 is spaced apart from each other so as to provide the gaps at the corners of the polygon, the magnitude of current flowing toward the corners of the polygon in the radial direction is further reduced.

Figure 3:
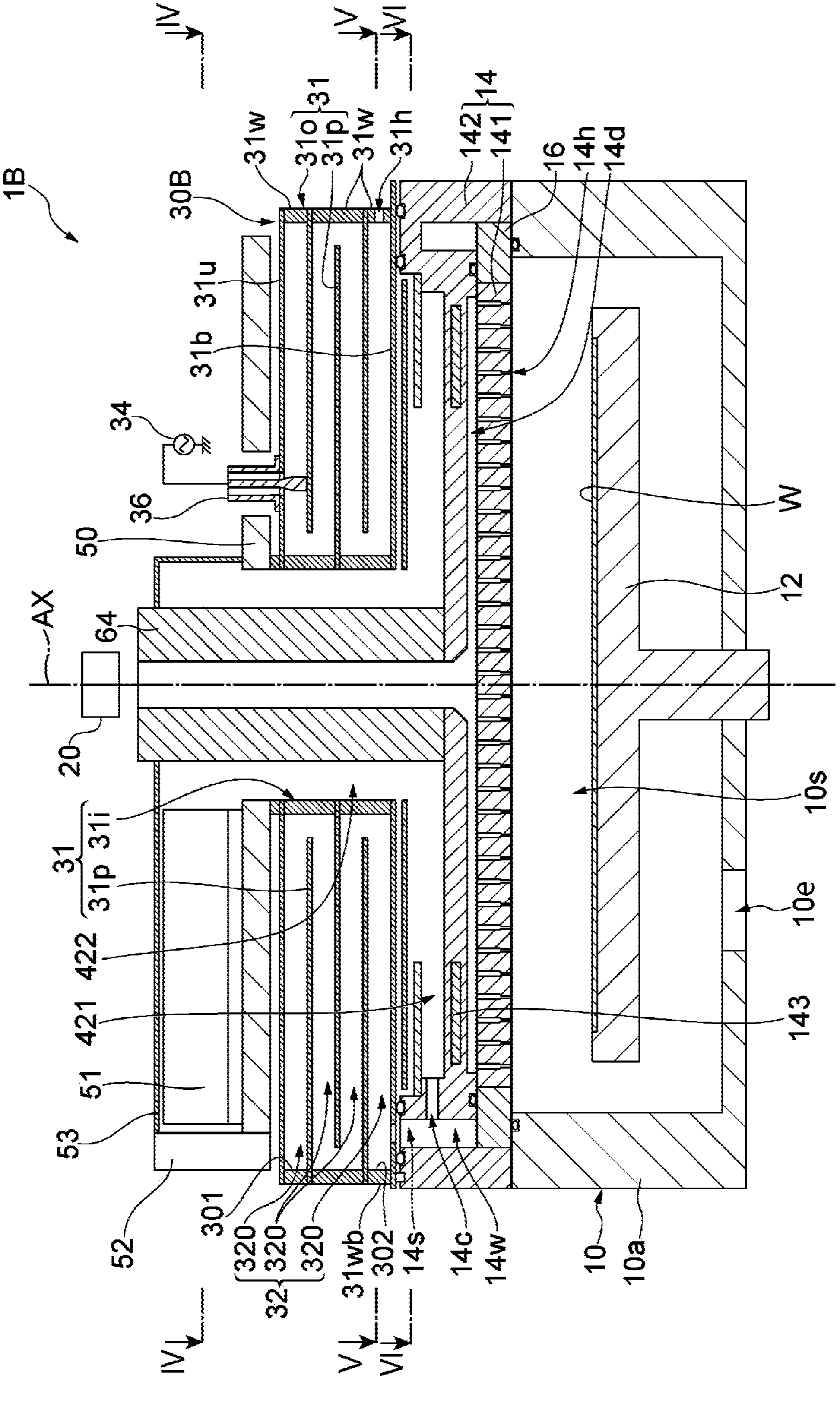
FIG. 3 is a diagram illustrating a plasma processing apparatus according to another exemplary embodiment.
Figure 4:
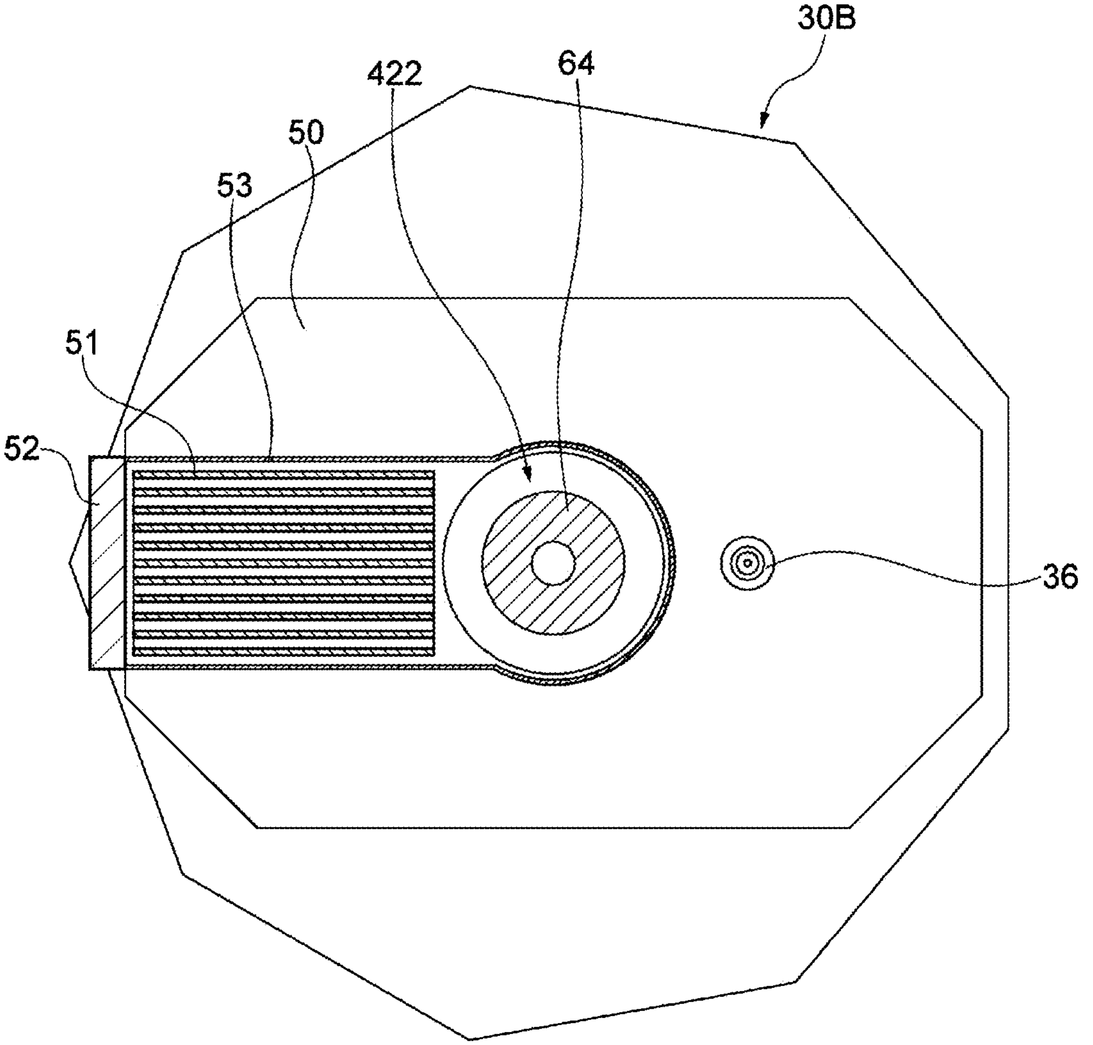
FIG. 4 is a cross-sectional view taken along line IV-IV in FIG. 3.
Figure 5:
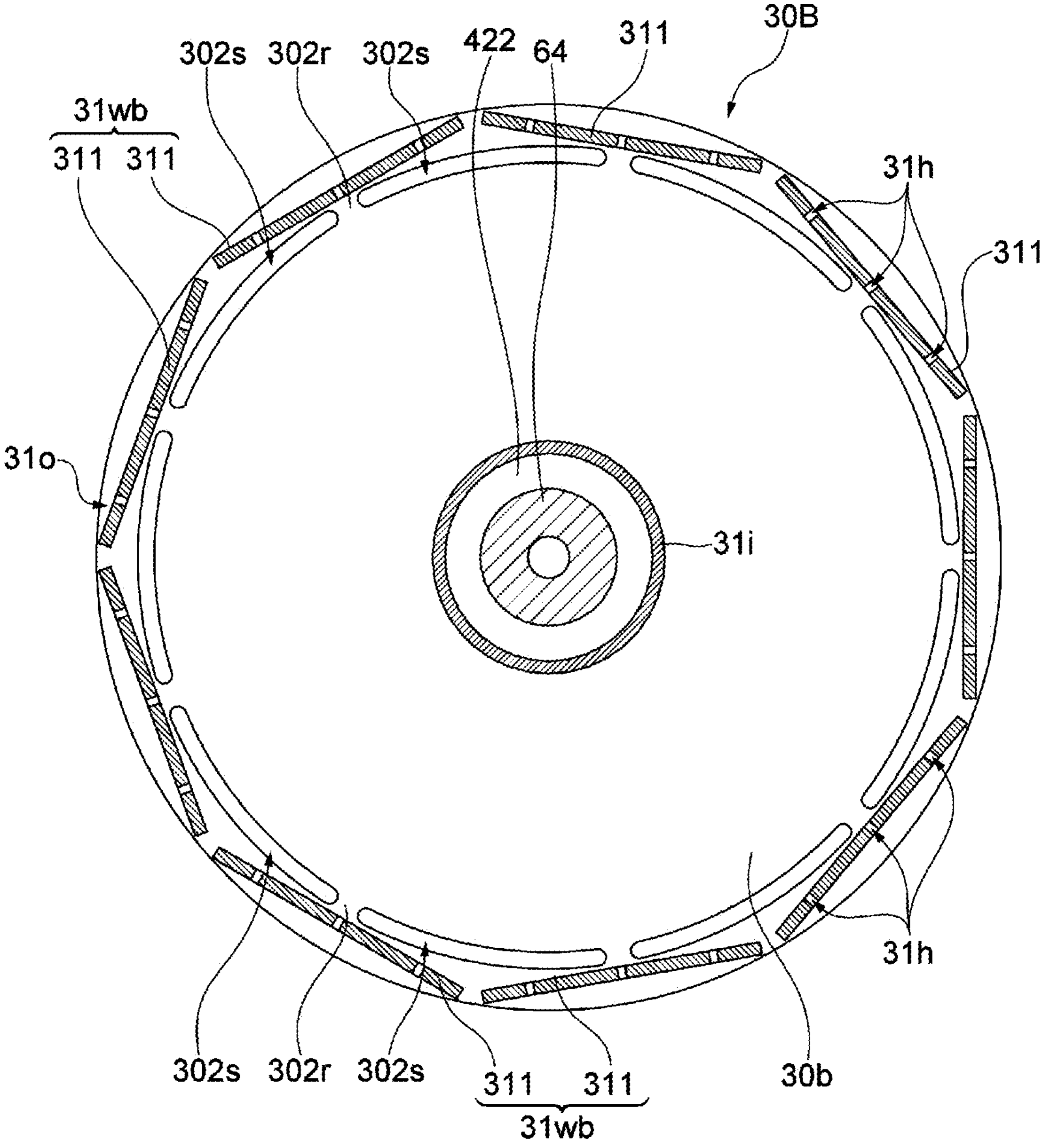
FIG. 5 is a cross-sectional view taken along line V-V in FIG. 3.
Figure 6:
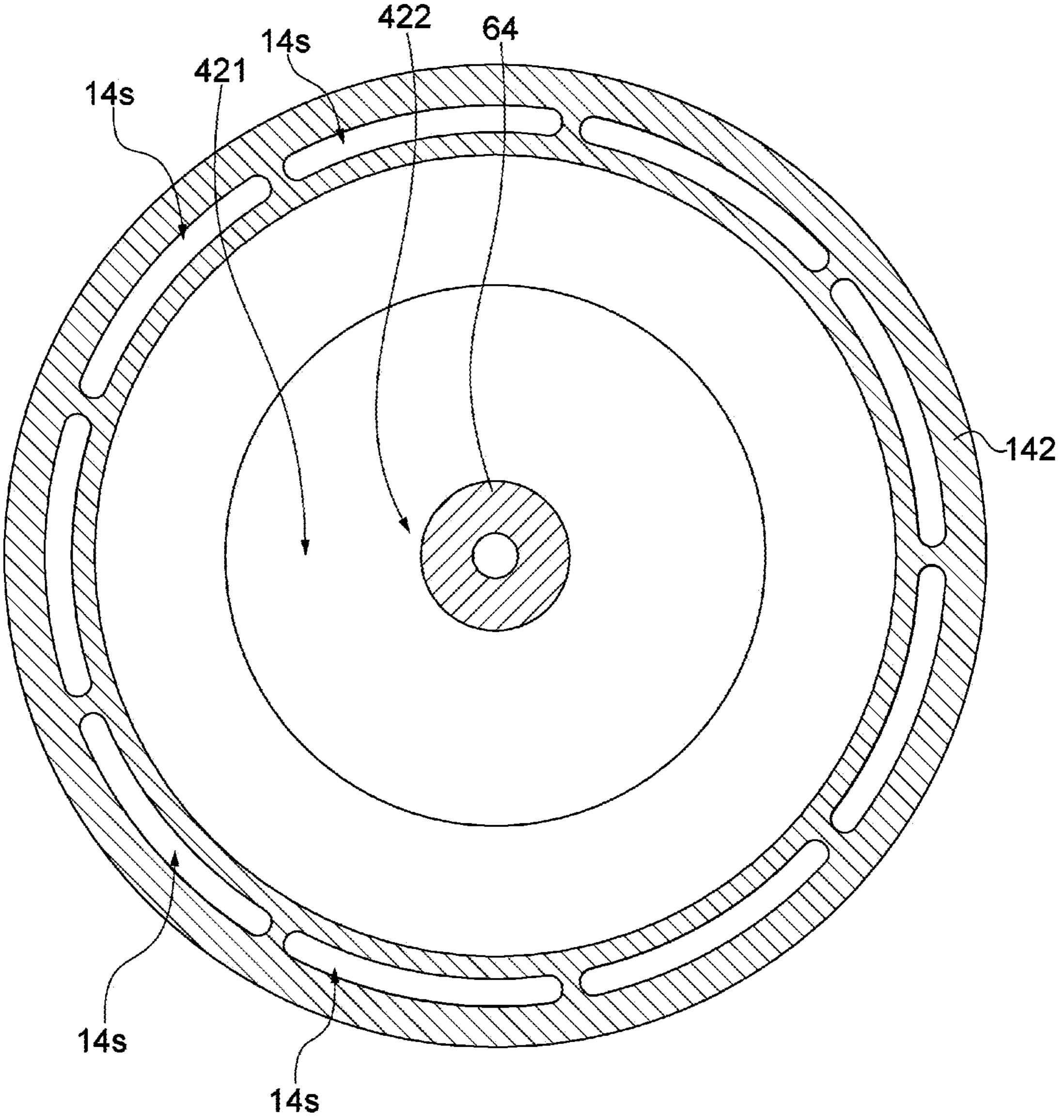
FIG. 6 is a cross-sectional view taken along line VI-VI in FIG. 3.

Hereinafter, a plasma processing apparatus according to another exemplary embodiment will be described with reference to FIGS. 3 to 6. FIG. 3 is a diagram illustrating a plasma processing apparatus according to another exemplary embodiment. FIG. 4 is a cross-sectional view taken along line IV-IV in FIG. 3. FIG. 5 is a cross-sectional view taken along line V-V in FIG. 3. FIG. 6 is a cross-sectional view taken along line VI-VI in FIG. 3. Hereinafter, a plasma processing apparatus 1B illustrated in FIGS. 3 to 6 will be described from the viewpoint of differences from the plasma processing apparatus 1.

The plasma processing apparatus 1B does not include the electrode 60. In the plasma processing apparatus 1B, the discharger 16 extends to surround the shower plate 141. The shower plate 141 and the discharger 16 close the opening of the upper end of the chamber 10. In the plasma processing apparatus 1B, the plasma generation space is a space which is within the processing space 10*s* and is directly below the shower plate 141.

The plasma processing apparatus 1B may further include a gas pipe 64. The gas pipe 64 extends inside the inner side portion 31*i* in the vertical direction. A central axis line of the gas pipe 64 is located on the axis line AX. The gas pipe 64 is connected between the gas diffusion chamber 14*d* and the gas supply 20.

The plasma processing apparatus 1B includes a resonator 30B instead of the resonator 30. Hereinafter, the resonator 30B will be described from the viewpoint of differences from the resonator 30. In the resonator 30B, the plurality of slots 302*s* is formed in the conductive plate 31*b* different from the upper electrode 142. The conductive plate 31*b* extends above the upper electrode 142.

In the resonator 30B, the number of the slots 302*s* is nine. That is, the number of the slots 302*s* is an odd number. When the number of the slots 302_s_ is an odd number, generation of an electric field intensity distribution (or plasma density distribution), which has a two-fold rotational symmetry around the axis line AX in the plasma generation space, is suppressed as compared to the case in which the number of the slots 302_s_ is an even number. If the number of the slots 302_s_ is five or more, the number of the slots 302_s_ may be an odd number other than nine. Further, the number of slots 302_s_ in the resonator 30B may be an even number.

Even in the plasma processing apparatus 1B, similarly to the plasma processing apparatus 1, the wall 31_wb_ of the outer side portion 31_o_ extends along the sides of the polygon in cross section perpendicular to the axis line AX. Two or more or all of the walls 31_w_ among the plurality of walls 31_w_ may extend along the sides of the polygon in cross section perpendicular to the axis line AX. In the plasma processing apparatus 1B, the plurality of plate-like bodies 311 is spaced apart from each other so as to provide gaps at the corners of the polygon. However, even in the plasma processing apparatus 1B, an edge of each of the plurality of plate-like bodies 311 vertically extending may be connected to an edge of another corresponding plate-like body vertically extending among the plurality of plate-like bodies 311 at a corresponding corner of the polygon.

Even in the plasma processing apparatus 1B, similarly to the plasma processing apparatus 1, the number of the plurality of slots 302_s_ and the number of the plurality of corners of the polygon may be equal. Therefore, in the plasma processing apparatus 1B, the number of corners of the polygon may be an odd number. In the illustrated example, the polygon is a regular nonagon. Even in the plasma processing apparatus 1B, the position of each of the plurality of corners of the polygon and the center position of a corresponding slot in the circumferential direction among the plurality of slots 302_s_ may be aligned in the radial direction with respect to the axis line AX.

Further, the resonator 30B provides a plurality of inlets 31_h_, which connects the and the outside of the resonator 30B to each other, in any wall 31_w_ of the outer side portion 31_o_. The plurality of inlets 31_h_ may be arranged in the circumferential direction. In one embodiment, the plurality of inlets 31_h_ is provided in the wall 31_wb_ and connects the lowermost layer of the plurality of layers 320 of the waveguide path 32 to the outside of the resonator 30B.

In the plasma processing apparatus 1B, the excitation electrode 14 (e.g., the upper electrode 142) may have a heating mechanism 143 built therein. The heating mechanism 143 may be a heater, such as a resistive heating element. In this case, the heating mechanism 143 is connected to a heater power supply. The power of the heater power supply may be controlled by a controller depending on a difference between a temperature value of the excitation electrode 14 measured by a temperature sensor and a target temperature value of the excitation electrode 14.

In the plasma processing apparatus 1B, the upper electrode 142 provides a plurality of slots 14_s_. The plurality of slots 14_s_ is provided directly below the plurality of slots 302_s_, respectively. The upper electrode 142 provides a waveguide path 14_w_ between each of the plurality of slots 302_s_ and the discharger 16. The waveguide path 14_w_ extends in the circumferential direction centered on the axis line AX and has an annular shape when viewed in a plan view. In the plasma processing apparatus 1B, electromagnetic waves discharged from the plurality of slots 302_s_ are supplied to the discharger 16 via the plurality of slots 14_s_ and the waveguide path 14_w_.

Further, the upper electrode 142 provides a cavity 421 which is positioned radially inside the waveguide path 14_w_ and between the upper electrode 142 and the resonator 30B. The cavity 421 is connected to the waveguide path 14_w_ via a plurality of communication holes 14_c_. The plurality of communication holes 14_c_ is arranged in the circumferential direction. In the plasma processing apparatus 1B, the cavity 421 is connected to a space outside the resonator 30B via the inlet 31_h_, the waveguide path 32, the plurality of slots 302_s_, the plurality of slots 14_s_, the waveguide path 14_w_, and the plurality of communication holes 14_c_.

The plasma processing apparatus 1B further includes a heat sink 51 and a fan 52. The heat sink 51 is disposed on a support body 50 above the resonator 30B. The fan 52 is supported by the support body 50 and is connected to a flow path in the heat sink 51. Further, in the plasma processing apparatus 1B, a cavity 422 is provided between the inner side portion 31_i_ of the resonator 30B and the gas pipe 64. The cavity 422 is connected between the cavity 421 and the flow path of the heat sink 51. The cavity 421 and the heat sink 51 are covered by a cover 53.

In the plasma processing apparatus 1B, gas (e.g., atmospheric air) outside the resonator 30B is supplied to the cavity 421 via the inlet 31_h_, the waveguide path 32, the plurality of slots 302_s_, the plurality of slots 14_s_, the waveguide path 14_w_, and the plurality of communication holes 14_c_. The gas supplied to the cavity 421 flows along the upper surface of the upper electrode 142 and exchanges heat with the upper electrode 142, i.e., the excitation electrode 14. Thereafter, the gas is supplied to the flow path in the heat sink 51 via the cavity 422, cooled in the heat sink 51, and discharged to the outside from the fan 52.

While various embodiments have been described, these embodiments are not intended to limit the scope of the disclosure. Various omissions, substitutions and changes in the form of the embodiments described herein may be made. Another embodiment may be possible by combining the elements in different embodiments.

Herein, various exemplary embodiments included in the present disclosure are described in E1 to E8 below.

[E1] A plasma processing apparatus includes:

a chamber configured to provide a processing space therein;

a substrate support provided in the processing space;

an excitation electrode provided above the substrate support;

a discharger provided to discharge electromagnetic waves into a plasma generation space below the excitation electrode, and a resonator provided on the excitation electrode and electromagnetically coupled to the discharger, wherein the discharger extends around a central axis line of the chamber and the excitation electrode, wherein the resonator includes an inner side portion and an outer side portion extending coaxially with respect to the central axis line, and a plurality of conductive plates arranged parallel to each other in a vertical direction, which is a direction in which the central axis line extends, and provides a waveguide path extending between the outer side portion and the inner side portion and including a plurality of layers arranged alternately with the plurality of conductive plates, wherein each of the plurality of layers is connected to a layer thereabove among the plurality of layers at one of a plurality of folded portions along the inner side portion or the outer side portion;

wherein a lowermost conductive plate among the plurality of conductive plates includes a plurality of slots electromagnetically coupled to the discharger, wherein the plurality of slots is arranged in a circumferential direction with respect to the central axis line, and wherein a wall surrounding a lowermost layer among the plurality of layers in the outer side portion extends along sides of a polygon in cross section perpendicular to the central axis line.

[E2] In the plasma processing apparatus of E1, the number of the plurality of slots and the number of a plurality of corners of the polygon are equal.

[E3] In the plasma processing apparatus of E2, a position of each of the plurality of corners of the polygon and a center position of a corresponding slot in the circumferential direction among the plurality of slots are aligned in a radial direction with respect to the central axis line.

[E4] In the plasma processing apparatus of any one of E1 to E3, a radial distance between the central axis line and an outer edge of each of the plurality of slots is substantially identical to a radius of an inscribed circle of the polygon.

[E5] In the plasma processing apparatus of any one of E1 to E4, the wall surrounding the lowermost layer is composed of a plurality of plate-like bodies made of a metal, and the plurality of plate-like bodies constitutes a plurality of sides of the polygon, respectively.

[E6] In the plasma processing apparatus of E5, an edge of each of the plurality of plate-like bodies vertically extending is connected to an edge of another corresponding plate-like body vertically extending among the plurality of plate-like bodies at a corresponding corner of the polygon.

[E7] In the plasma processing apparatus of E5, the plurality of plate-like bodies is spaced apart from each other so as to provide gaps at corners of the polygon.

[E8] In the plasma processing apparatus of any one of E1 to E7, a wall surrounding each of the plurality of layers in the outer side portion extends along the sides of the polygon in cross section perpendicular to the central axis line.

According to one exemplary embodiment, it is possible to adjust an intensity distribution of an electric field in a slot of a resonator in a plasma processing apparatus.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A plasma processing apparatus, comprising:

a chamber configured to provide a processing space therein;

a substrate support provided in the processing space;

an excitation electrode provided above the substrate support;

a discharger provided to discharge electromagnetic waves into a plasma generation space below the excitation electrode; and a resonator provided on the excitation electrode and electromagnetically coupled to the discharger, wherein the discharger extends around a central axis line of the chamber and the excitation electrode, wherein the resonator includes:

an inner side portion and an outer side portion extending coaxially with respect to the central axis line; and a plurality of conductive plates arranged parallel to each other in a vertical direction, which is a direction in which the central axis line extends, wherein the resonator provides a waveguide path extending between the outer side portion and the inner side portion and including a plurality of layers arranged alternately with the plurality of conductive plates, wherein each of the plurality of layers is connected to a layer thereabove among the plurality of layers at one of a plurality of folded portions along the inner side portion or the outer side portion;

wherein a lowermost conductive plate among the plurality of conductive plates includes a plurality of slots electromagnetically coupled to the discharger, wherein the plurality of slots is arranged in a circumferential direction with respect to the central axis line, and wherein a wall surrounding a lowermost layer among the plurality of layers in the outer side portion extends along sides of a polygon in cross section perpendicular to the central axis line.

2. The plasma processing apparatus of claim 1, wherein a number of the plurality of slots and a number of a plurality of corners of the polygon are equal.

3. The plasma processing apparatus of claim 2, wherein a position of each of the plurality of corners of the polygon and a center position of a corresponding slot in the circumferential direction among the plurality of slots are aligned in a radial direction with respect to the central axis line.

4. The plasma processing apparatus of claim 3, wherein a radial distance between the central axis line and an outer edge of each of the plurality of slots is substantially identical to a radius of an inscribed circle of the polygon.

5. The plasma processing apparatus of claim 1, wherein a radial distance between the central axis line and an outer edge of each of the plurality of slots is substantially identical to a radius of an inscribed circle of the polygon.

6. The plasma processing apparatus of claim 1, wherein the wall surrounding the lowermost layer is composed of a plurality of plate-like bodies made of a metal, and wherein the plurality of plate-like bodies constitutes a plurality of sides of the polygon, respectively.

7. The plasma processing apparatus of claim 6, wherein an edge of each of the plurality of plate-like bodies vertically extending is connected to an edge of another corresponding plate-like body vertically extending among the plurality of plate-like bodies at a corresponding corner of the polygon.

8. The plasma processing apparatus of claim 6, wherein the plurality of plate-like bodies is spaced apart from each other so as to provide gaps at corners of the polygon.

9. The plasma processing apparatus of claim 1, wherein a wall surrounding each of the plurality of layers in the outer side portion extends along the sides of the polygon in cross section perpendicular to the central axis line.

* * * * *